(12) United States Patent
You

(10) Patent No.: US 12,016,222 B2
(45) Date of Patent: Jun. 18, 2024

(54) DISPLAY DEVICE HAVING DUMMY PATTERN IN BENDING AREA EXTENDING TO PAD AREA

(71) Applicant: SAMSUNG DISPLAY CO., LTD., Yongin-si (KR)

(72) Inventor: Chungi You, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 577 days.

(21) Appl. No.: 17/313,925

(22) Filed: May 6, 2021

(65) Prior Publication Data
US 2022/0028956 A1 Jan. 27, 2022

(30) Foreign Application Priority Data

Jul. 23, 2020 (KR) .......................... 10-2020-0091858

(51) Int. Cl.
*H10K 59/131* (2023.01)
*H10K 59/122* (2023.01)
*H10K 59/124* (2023.01)

(52) U.S. Cl.
CPC ......... *H10K 59/131* (2023.02); *H10K 59/122* (2023.02); *H10K 59/124* (2023.02)

(58) Field of Classification Search
CPC ... H10K 59/131; H10K 59/122; H10K 59/124
See application file for complete search history.

(56) References Cited

U.S. PATENT DOCUMENTS

| 10,325,972 B2 | 6/2019 | Park et al. |
| 10,790,349 B2 | 9/2020 | Rhe et al. |
| 2018/0286938 A1* | 10/2018 | Moon ................. H10K 77/111 |
| 2019/0019441 A1 | 1/2019 | Shin et al. |
| 2019/0123126 A1 | 4/2019 | Song et al. |
| 2019/0386081 A1* | 12/2019 | Okabe .................. H10K 59/88 |
| 2020/0243618 A1 | 7/2020 | Song et al. |

FOREIGN PATENT DOCUMENTS

| KR | 10-2018-0059633 | 6/2018 |
| KR | 10-2019-0007570 | 1/2019 |
| KR | 10-2019-0014230 | 2/2019 |
| KR | 10-2019-0037380 | 4/2019 |
| KR | 10-2019-0045962 | 5/2019 |
| KR | 10-2020-0094885 | 8/2020 |

\* cited by examiner

*Primary Examiner* — Lex H Malsawma
(74) *Attorney, Agent, or Firm* — KILE PARK REED & HOUTTEMAN PLLC

(57) ABSTRACT

A display device including a substrate including a display area, a pad area, and a bending area, the pad area being outside the display area, and the bending area being between the display area and the pad area, a connection line extending in a direction from the display area to the pad area, and arranged in the bending area, a first organic insulating layer and a second organic insulating layer, which are sequentially arranged to cover the connection line, and a dummy pattern between the first organic insulating layer and the second organic insulating layer, wherein the dummy pattern includes a first extension portion and a second extension portion that each extend from the bending area to the pad area.

19 Claims, 11 Drawing Sheets

DISPLAY DEVICE HAVING DUMMY PATTERN IN BENDING AREA EXTENDING TO PAD AREA

CROSS-REFERENCE TO RELATED APPLICATION

This application claims priority from and the benefit of Korean Patent Application No. 10-2020-0091858, filed on Jul. 23, 2020, which is hereby incorporated by reference for all purposes as if fully set forth herein.

BACKGROUND

Field

Exemplary embodiments of the invention relate to display devices.

Discussion of the Background

As the information society develops, the demand for various display devices for displaying images has increased. In the field of display devices, thin, lightweight, and large-area flat panel display devices (FPDs) have rapidly increased in popularity, replacing bulky cathode ray tubes (CRTs). FPDs include liquid crystal displays (LCD), plasma display panels (PDPs), organic light-emitting diode (OLED) displays, and electrophoretic displays (EPDs).

These display devices may include a display area that implements an image and a peripheral area that does not implement an image. In recent years, research has been actively conducted to reduce the area of the peripheral area that a user may visually recognize. As an example, research into a display device in which a portion of a peripheral area bends has been actively conducted.

The above information disclosed in this Background section is only for understanding of the background of the inventive concepts, and, therefore, it may contain information that does not constitute prior art.

SUMMARY

Exemplary embodiments of the invention include a display device in which reliability is improved by preventing connection lines in a bending area from being damaged.

Additional features will be set forth in part in the description which follows and, in part, will be apparent from the description, or may be learned by practice of the presented embodiments of the disclosure.

An exemplary embodiment of the invention provides a display device including a substrate including a display area, a pad area, and a bending area, the pad area being located outside the display area, and the bending area being located between the display area and the pad area, a connection line extending in a direction from the display area to the pad area, and arranged in the bending area, a first organic insulating layer and a second organic insulating layer, which are sequentially arranged to cover the connection line, and a dummy pattern between the first organic insulating layer and the second organic insulating layer. The dummy pattern includes a first extension portion and a second extension portion, the first extension portion and the second extension portion each extending from the bending area to the pad area.

The connection line may include a first connection line and a second connection line, and the dummy pattern may overlap each of the first connection line and the second connection line.

The first extension portion and the second extension portion may be spaced apart from each other in the pad area.

The second organic insulating layer may include an insulating layer opening portion overlapping the pad area, and at least one of the first extension portion and the second extension portion may be exposed by the insulating layer opening portion.

The connection line and the dummy pattern may be electrically insulated from each other.

The display device may further include a display element above the display area, the display element including a pixel electrode and an opposite electrode, and the dummy pattern may include a same material as a material of the pixel electrode.

The display device may further include a thin-film transistor above the substrate, the thin-film transistor being connected to the display element, a first planarization layer and a second planarization layer between the thin-film transistor and the pixel electrode, and a pixel defining layer covering an edge of the pixel electrode, the pixel defining layer including an opening that exposes a central portion of the pixel electrode. The first organic insulating layer may include the same material as a material of the second planarization layer, and the second organic insulating layer may include the same material as a material of the pixel defining layer.

The display device may further include an inorganic insulating layer above the substrate, and the inorganic insulating layer may include a lower opening portion that overlaps the bending area.

The display device may further include a lower organic insulating layer below the first organic insulating layer, and the lower organic insulating layer may overlap the lower opening portion.

The dummy pattern may be spaced apart from the display area.

Another exemplary embodiment of the invention provides a display device including a substrate including a display area, a pad area, and a bending area, the pad area being located outside the display area, and the bending area being located between the display area and the pad area, a connection line extending in a direction from the display area to the pad area, and arranged in the bending area, a first organic insulating layer and a second organic insulating layer, which are sequentially arranged to cover the connection line, and a plurality of dummy patterns between the first organic insulating layer and the second organic insulating layer, the plurality of dummy patterns being in the bending area.

The plurality of dummy patterns may include a first dummy pattern and a second dummy pattern, and the first dummy pattern and the second dummy pattern may be spaced apart from each other in the bending area.

The connection line may include a first connection line and a second connection line, the first connection line and the second connection line being adjacent to each other, and the first connection line and the second connection line may each overlap the first dummy pattern.

The connection line may include a first connection line and a second connection line, the first connection line and the second connection line being adjacent to each other, the first connection line may overlap the first dummy pattern, and the second connection line may overlap the second dummy pattern.

The first dummy pattern may include a first extension portion and a second extension portion, the first extension portion and the second extension portion each extending from the bending area to the pad area.

The second organic insulating layer may include an insulating layer opening portion that overlaps the pad area, and at least one of the first extension portion and the second extension portion may be exposed by the insulating layer opening portion.

The connection line and the plurality of dummy patterns may be electrically insulated from each other.

The display device may further include a display element located above the display area, the display element comprising a pixel electrode and an opposite electrode. The plurality of dummy patterns may include a same material as a material of the pixel electrode.

The display device may further include a thin-film transistor above the substrate, the thin-film transistor being connected to the display element, a first planarization layer and a second planarization layer between the thin-film transistor and the pixel electrode, and a pixel defining layer covering an edge of the pixel electrode, the pixel defining layer including an opening that exposes a central portion of the pixel electrode. The first organic insulating layer may include the same material as a material of the second planarization layer, and the second organic insulating layer may include the same material as a material of the pixel defining layer.

The display device may further include an inorganic insulating layer above the substrate, and the inorganic insulating layer may include a lower opening portion that overlaps the bending area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
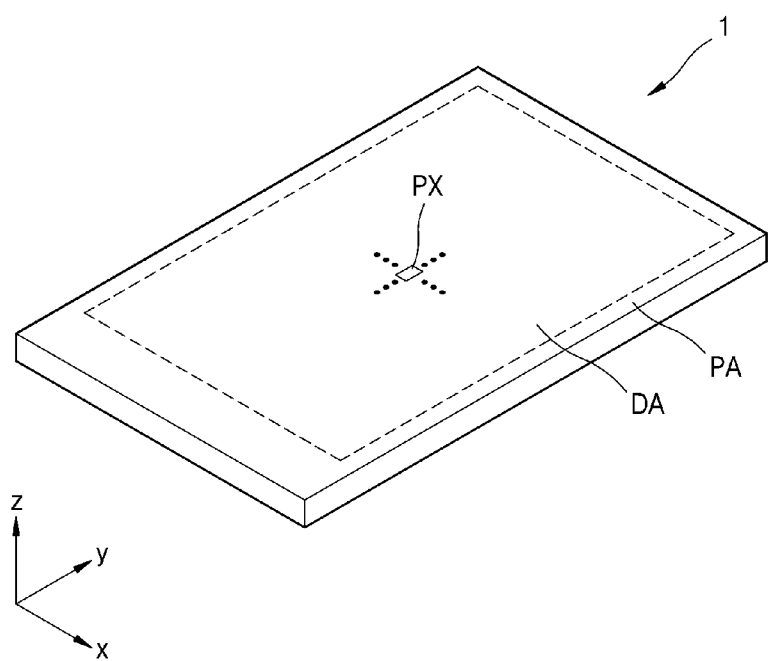
FIG. 1 is a perspective view schematically illustrating a display device, according to an embodiment.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
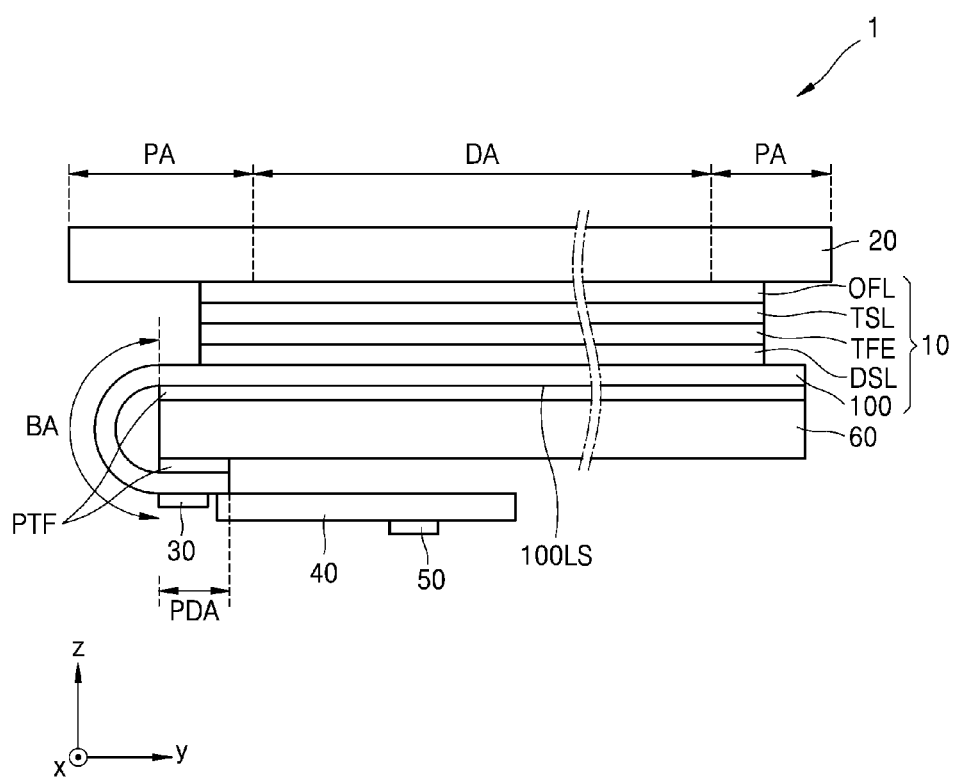
FIG. 2 is a cross-sectional view schematically illustrating a display device, according to an embodiment.

FIG. 1 is a perspective view schematically illustrating a display device 1, according to an embodiment. FIG. 2 is a cross-sectional view schematically illustrating the display device 1.

Referring to FIG. 1, the display device 1 is a device that displays a moving picture or a still image, and may be used not only in mobile phones, smart phones, tablet personal computers (PCs), mobile communication terminals, electronic notebooks, electronic books, portable multimedia players (PMPs), navigations, and ultra mobile PCs (UMPCs), but also in a display screen of various products, such as televisions, laptops, monitors, billboards, and Internet of Things (IoT) devices. In addition, the display device 1 according to an embodiment may be used in a wearable device such as smart watches, watch phones, glasses-type displays, and head mounted displays (HMDs). In addition, the display device 1 according to an embodiment may be used as an instrument panel, a center information display (CID) arranged on a center fascia or dashboard of a vehicle, a room mirror display in place of a side-view mirror of a vehicle, and a display arranged on a rear surface of a front seat as an entertainment for the backseat of a vehicle.

The display device 1 may have an approximately rectangular shape, as shown in FIG. 1. For example, the display device 1 may have a rectangular planar shape overall with a short side extending in a first direction (e.g., the x direction or the −x direction) and a long side extending in a second direction (e.g., the y direction or the −y direction), as shown in FIG. 1. In an embodiment, a portion where the short side extending in the first direction (e.g., the x direction or the −x direction) meets the long side extending in the second direction (e.g., the y direction or the −y direction) may have a right angle shape or may have a round shape having a certain curvature. However, a planar shape of the display device 1 is not limited to a rectangle, and the display device 1 may have other polygonal, circular, or elliptical shapes.

The display device 1 may include a display area DA and a peripheral area PA. The display area DA may be an area in which an image is displayed. A plurality of pixels PX may be arranged in the display area DA. The display device 1 may provide an image by using light emitted from the pixels PX. Each of the pixels PX may emit light by using a display element. In an embodiment, each of the pixels PX may emit red, green, or blue light. In another embodiment, each of the pixels PX may emit red, green, blue, or white light.

The peripheral area PA is an area in which an image is not provided, and may be a non-display area. The peripheral area PA may at least partially surround the display area DA. For example, the peripheral area PA may entirely surround the display area DA. A driving unit for providing electrical signals to the pixels PX, a power line for supplying power, or the like may be in the peripheral area PA. For example, a scan driving unit for applying a scan signal to the pixels PX may be in the peripheral area PA. For example, a data driving unit for applying a data signal to the pixels PX may be in the peripheral area PA.

Referring to FIG. 2, the display device 1 may include a display panel 10, a cover window 20, a display driving unit 30, a display circuit board 40, a touch sensor driving unit 50, a cushion layer 60, and a protective film PTF.

The display panel 10 may display information processed by the display device 1. For example, the display panel 10 may display execution screen information of an application driven by the display device 1 or may display user interface (UI) and graphical user interface (GUI) information according to the execution screen information.

The display panel 10 may include display elements. For example, the display panel 10 may include an organic light-emitting diode display panel using an organic light-emitting diode, a micro light-emitting diode (LED) display panel using a micro LED, a quantum dot light-emitting display panel using a quantum dot LED including a quantum dot emission layer, or an inorganic light-emitting display panel using an inorganic light-emitting device including an inorganic semiconductor. Hereinafter, a detailed description will be given focusing on the case where the display panel 10 is an organic light-emitting display panel in which an organic light-emitting diode is used as a display element.

The display panel 10 may include a substrate 100 and a multi-layer film above the substrate 100. In an embodiment, the display panel 10 may include the substrate 100, a display layer DSL, a thin-film encapsulation layer TFE, a touch sensor layer TSL, and an optical functional layer OFL. In this case, the display area DA and the peripheral area PA may be defined on the substrate 100 and/or the multi-layer film. For example, the substrate 100 may include the display area DA and the peripheral area PA. In addition, the peripheral area PA may include a pad area PDA and a bending area BA.

The substrate 100 may include a polymer resin, such as polyethersulfone, polyarylate, polyetherimide, polyethylene naphthalate, polyethylene terephthalate, polyphenylene sulfide, polyimide, polycarbonate, cellulose triacetate, cellulose acetate propionate, or the like. In an embodiment, the substrate 100 may have a multilayer structure that includes a base layer and a barrier layer (not shown), the base layer including the polymer resin described above. The substrate 100 including the polymer resin may be flexible, rollable, or bendable.

The substrate 100 may bend in the bending area BA. In this case, at least portions of a lower surface 100LS of the substrate 100 may face each other, and the pad area PDA of the substrate 100 may be below the other portions of the substrate 100. Therefore, the area of the peripheral area PA visible to the user may be reduced. In FIG. 2, only the substrate 100 bends, but in another embodiment, at least a portion of the display layer DSL, at least a portion of the thin-film encapsulation layer TFE, and at least a portion of the touch sensor layer TSL may also be in the bending area BA and the pad area PDA. In this case, the at least a portion of the display layer DSL, the at least a portion of the thin-film encapsulation layer TFE, and the at least a portion of the touch sensor layer TSL may also bend in the bending area BA.

The display layer DSL may be located above the substrate 100. The display layer DSL may include pixel circuits and display elements. In this case, the pixel circuits may be connected to the display elements. A pixel circuit may include a thin-film transistor and a storage capacitor. Accordingly, the display layer DSL may include a plurality of display elements, a plurality of thin-film transistors, and storage capacitors. In addition, the display layer DSL may further include insulating layers therebetween.

The thin-film encapsulation layer TFE may be above the display layer DSL. The thin-film encapsulation layer TFE may be above the display element and cover the display element. In an embodiment, the thin-film encapsulation layer TFE may include at least one inorganic encapsulation layer and at least one organic encapsulation layer. At least one inorganic encapsulation layer may include one or more inorganic materials of aluminum oxide ($Al_2O_3$), titanium oxide ($TiO_2$), tantalum oxide ($Ta_2O_5$), zinc oxide (ZnO), silicon oxide ($SiO_2$), silicon nitride ($SiN_x$), and silicon oxynitride (SiON). At least one organic encapsulation layer may include a polymer-based material. Examples of the polymer-based material may include an acrylic resin, an epoxy resin, polyimide, and polyethylene. In an embodiment, the at least one organic encapsulation layer may include acrylate.

The touch sensor layer TSL may be located above the thin-film encapsulation layer TFE. The touch sensor layer TSL may sense coordinate information according to an external input, for example, a touch event. The touch sensor layer TSL may include a sensor electrode and touch lines each connected to the sensor electrode. The touch sensor layer TSL may sense an external input according to a self-capacitance method or a mutual capacitance method.

The touch sensor layer TSL may be located above the thin-film encapsulation layer TFE. Alternatively, the touch sensor layer TSL may be separately formed on a touch substrate and then, bonded to the thin-film encapsulation layer TFE through an adhesive layer such as an optically transparent adhesive. In an embodiment, the touch sensor layer TSL may be formed directly above the thin-film encapsulation layer TFE, and in this case, the adhesive layer may not be between the touch sensor layer TSL and the thin-film encapsulation layer TFE.

The optical functional layer OFL may be above the touch sensor layer TSL. The optical functional layer OFL may reduce the reflectance of light (external light) incident from the outside toward the display device 1, and/or improve color purity of light emitted from the display device 1. In an embodiment, the optical functional layer OFL may include a retarder and a polarizer. The retarder may be of a film type or a liquid crystal coating type, and may include a $\lambda/2$ retarder and/or a $\lambda/4$ retarder. The polarizer may also be a film type or a liquid crystal coating type. The film type may include a stretched synthetic resin film, and the liquid crystal coating type may include liquid crystals arranged in a certain arrangement. The retarder and polarizer may each further include a protective film.

In an embodiment, the optical functional layer OFL may include a black matrix and color filters. The color filters may be arranged by taking into account the colors of light beams emitted by the pixels of the display device 1. Each of the color filters may include a red, green, or blue pigment or dye. In an embodiment, each of the color filters may further include quantum dots in addition to the aforementioned pigment or dye. In an embodiment, some of the color filters may not include the aforementioned pigments or dyes, and may include scattering particles such as $TiO_2$.

In an embodiment, the optical functional layer OFL may include an offset interference structure. The offset interference structure may include a first reflective layer and a second reflective layer, the first reflective layer and the second reflective layer being arranged on different layers. First reflected light and second reflected light respectively reflected by the first reflection layer and the second reflection layer may destructively interfere with each other, and thus, the reflectance of external light may be reduced.

The cover window 20 may be above the display panel 10. The cover window 20 may protect the display panel 10. In an embodiment, the cover window 20 may be a flexible window. The cover window 20 may protect the display panel 10 by bending easily according to external force without cracking. The cover window 20 may include at least one of glass, sapphire, and plastic. The cover window 20 may include, for example, ultra-thin tempered glass (UTG) or colorless polyimide (CPI). In an embodiment, the cover window 20 may have a structure in which a flexible polymer layer is on one surface of a glass substrate, or may include only a polymer layer.

The display driving unit 30 may be in the pad area PDA. The display driving unit 30 may receive control signals and power voltages, and generate and output signals and voltages for driving the display panel 10. The display driving unit 30 may include an integrated circuit (IC).

The display circuit board 40 may be electrically connected to the display panel 10. For example, the display circuit board 40 may be electrically connected to the pad area PDA of the substrate 100 by using an anisotropic conductive film.

The display circuit board 40 may include a flexible printed circuit board (FPCB) that is bendable or a rigid printed circuit board (PCB) that is hard and does not bend easily. Alternatively, in some cases, the display circuit board 40 may include a composite printed circuit board including both a PCB and an FPCB.

The touch sensor driving unit 50 may be above the display circuit board 40. The touch sensor driving unit 50 may include an IC. The touch sensor driving unit 50 may be attached on the display circuit board 40. The touch sensor driving unit 50 may be electrically connected to sensor electrodes of the touch sensor layer TSL of the display panel 10 via the display circuit board 40.

In addition to the above, a power supply unit may be additionally arranged above the display circuit board 40. The power supply unit may apply a driving voltage for driving the pixels of the display panel 10 and the display driving unit 30.

The protective film PTF may be patterned and attached to the lower surface 100LS of the substrate 100. At this time, the protective film PTF may be attached to the substrate 100 except for the bending area BA. In this case, a portion of the protective film PTF may be on the opposite side of the display layer DSL with the substrate 100 therebetween. The other portion of the protective film PTF may be attached to the lower surface 100LS of the substrate 100 to correspond to the pad area PDA.

In an embodiment, the cushion layer 60 may be between the protective films PTF. The cushion layer 60 may absorb external shocks to prevent the display panel 10 from being damaged. The cushion layer 60 may include polymer resins such as polyurethane, polycarbonate, polypropylene, polyethylene, and the like, or may include an elastic material, such as a sponge formed by foam molding rubber, urethane-based material, or acrylic material.

Figure 3:
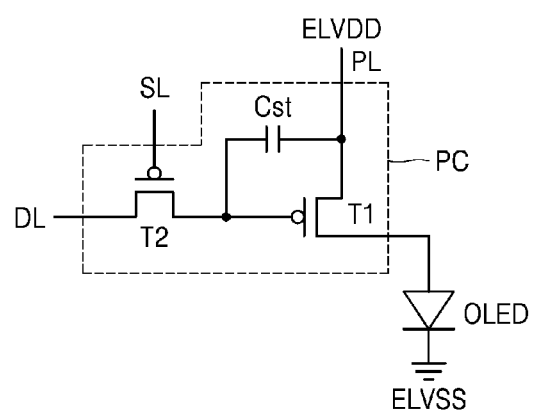
FIG. 3 is an equivalent circuit diagram schematically illustrating a pixel circuit applicable to a display panel.

FIG. 3 is an equivalent circuit diagram schematically illustrating a pixel circuit PC applicable to a display panel.

Referring to FIG. 3, the pixel circuit PC may be connected to a display element, for example, an organic light-emitting diode OLED. The pixel circuit PC may include a driving thin-film transistor T1, a switching thin-film transistor T2, and a storage capacitor Cst. In addition, the organic light-emitting diode OLED may emit red light, green light, or blue light, or may emit red light, green light, blue light, or white light.

The switching thin-film transistor T2 may be connected to a scan line SL and a data line DL, and, based on a scan signal or switching voltage input through the scan line SL, may transfer a data signal or a data voltage input from the data line DL to the driving thin-film transistor T1. The storage capacitor Cst is connected to the switching thin-film transistor T2 and a driving voltage line PL, and may store a voltage corresponding to the difference between the voltage transmitted from the switching thin-film transistor T2 and a first power voltage ELVDD applied to the driving voltage line PL.

The driving thin-film transistor T1 is connected to the driving voltage line PL and the storage capacitor Cst, and may control a driving current flowing through the organic light-emitting diode OLED from the driving voltage line PL in response to the voltage value stored in the storage capacitor Cst. The organic light-emitting diode OLED may emit light having a certain luminance according to driving current. An opposite electrode of the organic light-emitting diode OLED may receive a second power voltage ELVSS.

In FIG. 3, the pixel circuit PC includes two thin-film transistors and one storage capacitor, but the pixel circuit PC may include three or more thin-film transistors.

Figure 4:
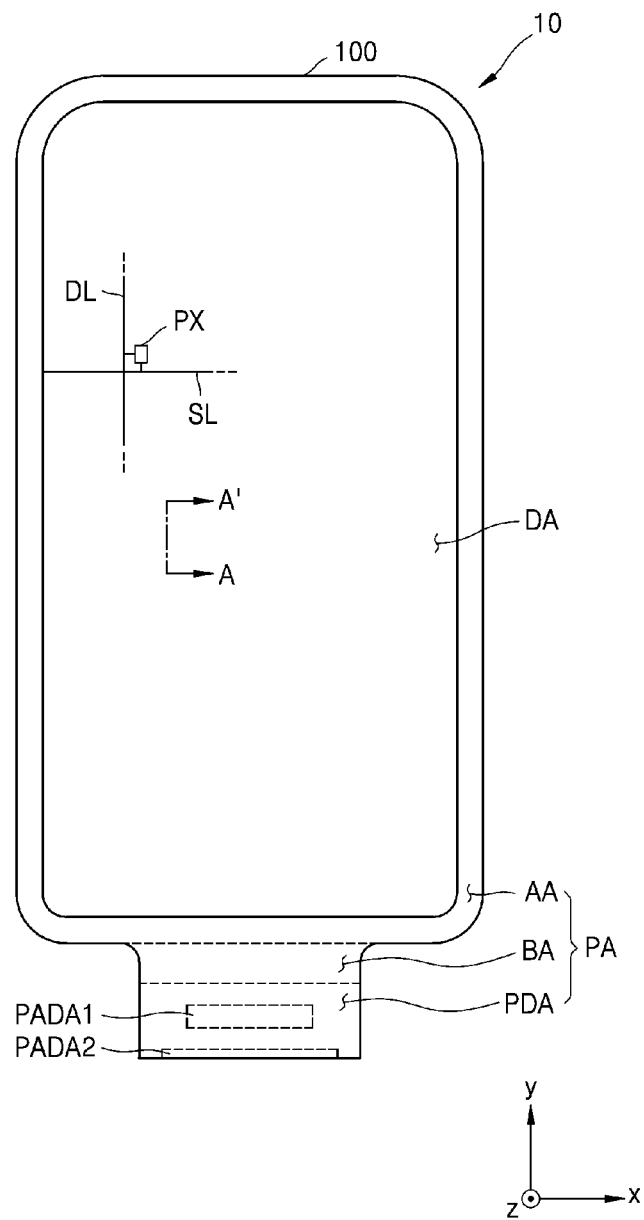
FIG. 4 is a plan view schematically illustrating a display panel, according to an embodiment.
Figure 5:
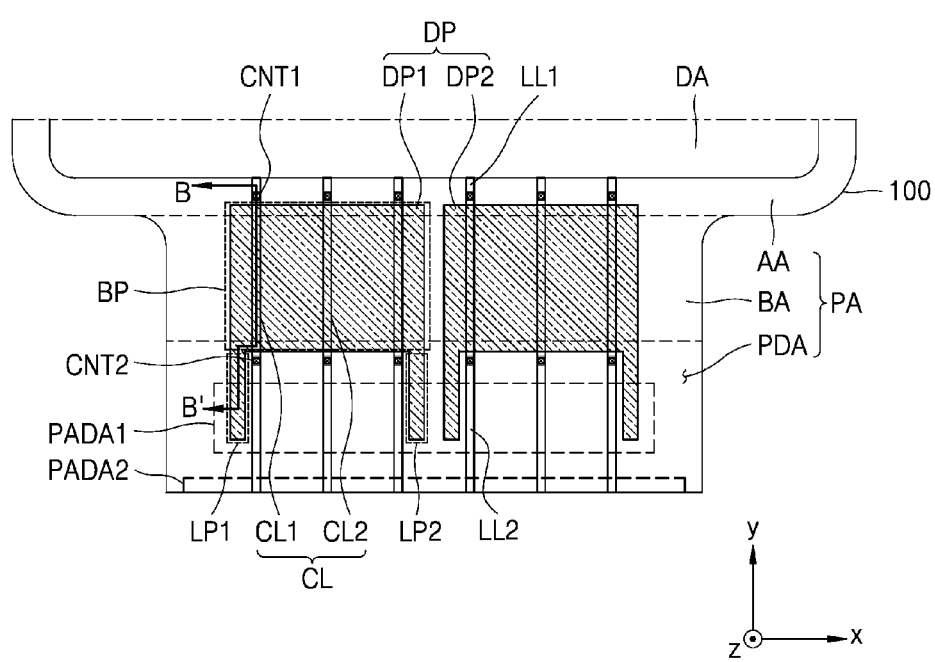
FIGS. 5 and 6 are each an enlarged view of a portion of a display panel, according to an embodiment.
Figure 6:
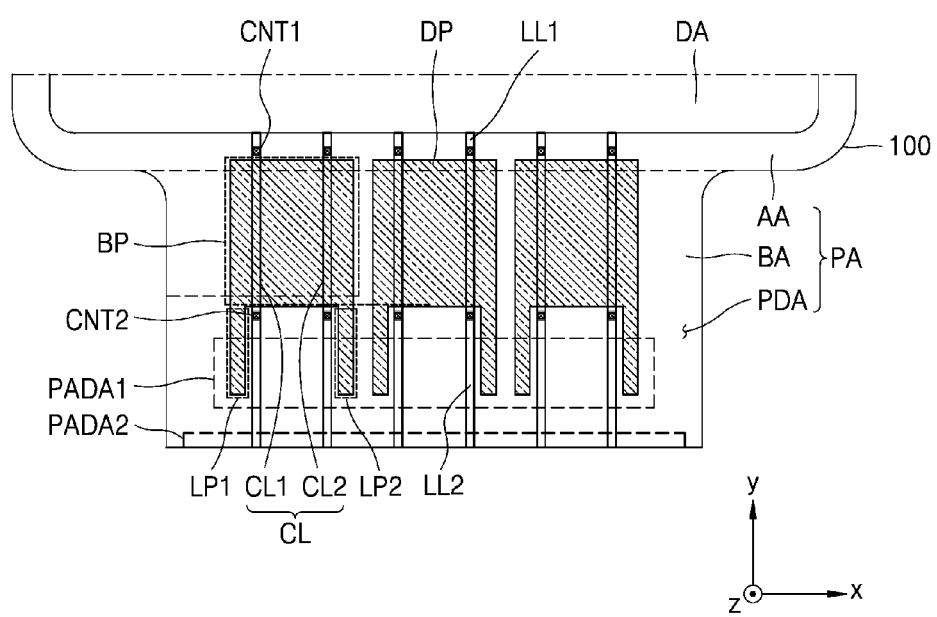

FIG. 4 is a plan view schematically illustrating a display panel 10, according to an embodiment. FIGS. 5 and 6 are each an enlarged view of a portion of a display panel, according to an embodiment. Each of FIGS. 4, 5, and 6 show a shape before the bending area BA of display panel 10 bends, and schematically shows a shape in which the display panel 10 unbends.

Referring to FIGS. 4 and 5, the display panel 10 may include a substrate 100, a connection line CL, a first lower line LL1, a second lower line LL2, and a dummy pattern DP. The substrate 100 may include a display area DA and a peripheral area PA. A plurality of pixels PX may be arranged in the display area DA. The pixels PX may be connected to a scan line SL and a data line DL, the scan line SL extending in a first direction (e.g., the x direction or the −x direction), and the data line DL extending in a second direction (e.g., the y direction or the −y direction). A pixel PX may emit light by using an organic light-emitting diode according to a scan signal transmitted by the scan line SL and a data signal transmitted by the data line DL.

The peripheral area PA is an area in which an image is not provided, and may be a non-display area. The peripheral area PA may at least partially surround the display area DA. The peripheral area PA may include an adjacent area AA, a pad area PDA, and a bending area BA.

The adjacent area AA may at least partially surround the display area DA. In an embodiment, the adjacent area AA may entirely surround the display area DA. The adjacent area AA may be closer to the display area DA than the pad area PDA.

The pad area PDA may be outside the display area DA. In an embodiment, the pad area PDA may be farther away from the display area DA than the bending area BA. The pad area PDA may include a first pad area PADA1 and a second pad area PADA2. The first pad area PADA1 may be closer to the display area DA than the second pad area PADA2 in the pad area PDA. In an embodiment, the first pad area PADA1 may be an area in which the display driving unit 30 (see FIG. 2) is arranged. The second pad area PADA2 may be farther away from the display area DA than the first pad area PADA1 in the pad area PDA. The second pad area PADA2 may include an edge of the peripheral area PA. In an embodiment, the second pad area PADA2 may be an area in which the display circuit unit 40 (see FIG. 2) is arranged.

The bending area BA may be between the display area DA and the pad area PDA. The bending area BA may be between the adjacent area AA and the pad area PDA. The pad area PDA may be connected to the adjacent area AA through the bending area BA.

The connection line CL may be in the bending area BA. The connection line CL may extend in a direction from the display area DA to the pad area PDA. For example, the connection line CL may extend in the second direction (for example, the y direction or the −y direction). The connection line CL may be plural. In this case, the connection lines CL may be spaced apart from each other. For example, a first connection line CL1 and a second connection line CL2, which are adjacent to each other, may be spaced apart from each other.

The connection line CL may be connected to each of the first lower line LL1 and the second lower line LL2. That is, the connection line CL may extend to cross the bending area BA so that the first lower line LL1 is electrically connected to the second lower line LL2. In an embodiment, the connection line CL may be on a different layer from a layer on which the first lower line LL1 is arranged, and may be connected to the first lower line LL1 via a first contact hole CNT1 in an insulating layer provided between the connection line CL and the first lower line LL1. In addition, in an embodiment, the connection line CL may be arranged on a different layer from a layer on which the second lower line LL2 is arranged, and may be connected to the second lower line LL2 via a second contact hole CNT2 in an insulating layer provided between the connection line CL and the second lower line LL2.

The first lower line LL1 may extend in a direction from the display area DA to the bending area BA. The first lower line LL1 may be above the adjacent area AA. In an embodiment, the first lower line LL1 may extend to the display area DA. The first lower line LL1 may be spaced apart from the bending area BA. Accordingly, the first lower line LL1 may not overlap the bending area BA.

The second lower line LL2 may extend in a direction from the bending area BA to the pad area PDA. The second lower line LL2 may be above the pad area PDA. In an embodiment, the second lower line LL2 may extend to the second pad area PADA2. In another embodiment, the second lower line LL2 may extend to the first pad area PADA1. The second lower line LL2 may be spaced apart from the bending area BA. Accordingly, the second lower line LL2 may not overlap the bending area BA.

In an embodiment, the second lower line LL2 may be exposed to the outside in at least one of the first pad area PADA1 and the second pad area PADA2. For example, when the second lower line LL2 is exposed in the first pad area PADA1, the second lower line LL2 may be electrically connected to the display driving unit 30 (see FIG. 2). As another example, when the second lower line LL2 is exposed in the second pad area PADA2, the second lower line LL2 may be electrically connected to the display circuit board 40 (see FIG. 2).

The first lower line LL1, the second lower line LL2, and/or the connection line CL may be signal lines for transmitting signals to the display area DA. For example, the first lower line LL1, the second lower line LL2, and/or the connection line CL may transmit a scan signal input from the display driving unit 30 (see FIG. 2) or the display circuit board 40 (see FIG. 2) to the scan line SL arranged in the display area DA. As another example, the first lower line LL1, the second lower line LL2, and/or the connection line CL may transmit a data signal applied from the display driving unit 30 (see FIG. 2) or the display circuit board 40 (see FIG. 2) to the data line DL arranged in the display area DA. As another example, the first lower line LL1, the second lower line LL2, and/or the connection line CL may transmit a touch signal transmitted from a touch line arranged in the display area DA to the touch sensor driving unit 50 (see FIG. 2) on the display circuit board 40 (see FIG. 2). As another example, the first lower line LL1, the second lower line LL2, and/or the connection line CL may transmit a power voltage to the display area DA.

The dummy pattern DP may be in the bending area BA. The dummy pattern DP may be spaced apart from the display area DA. For example, the dummy pattern DP may be spaced apart from the display area DA in the second direction (e.g., the y direction or the −y direction), and arranged in the peripheral area PA. The dummy pattern DP may include a body portion BP, a first extension portion LP1, and a second extension portion LP2. The body portion BP, the first extension portion LP1, and the second extension portion LP2 may be integrally provided.

In an embodiment, the body portion BP may extend in the second direction (e.g., the y direction or the −y direction) in the bending area BA. In this case, a portion of the body portion BP may extend to the peripheral area PA that does not bend. For example, a portion of the body portion BP may extend in the second direction (e.g., the y direction or the −y direction) and overlap the pad area PDA. In addition, a portion of the body portion BP may extend to the adjacent area AA.

The first extension portion LP1 and the second extension portion LP2 may each extend from the body portion BP. In this case, the first extension portion LP1 and the second extension portion LP2 may extend in the direction from the bending area BA to the pad area PDA. For example, the first extension portion LP1 and the second extension portion LP2 may each extend in the second direction (e.g., the y direction or the −y direction) in the pad area PDA.

In an embodiment, at least one of the first extension portion LP1 and the second extension portion LP2 may extend from the body portion BP to the first pad area PADA1. In this case, the first extension portion LP1 and the second extension portion LP2 may be exposed to the outside in the first pad area PADA1. In another embodiment, at least one of the first extension portion LP1 and the second extension portion LP2 may extend from the body portion BP to the second pad area PADA2. In this case, the first extension portion LP1 and the second extension portion LP2 may be exposed to the outside in the second pad area PADA2.

The first extension portion LP1 and the second extension portion LP2 may be spaced apart from each other. In an embodiment, the first extension portion LP1 and the second extension portion LP2 may be spaced apart from each other in the first direction (e.g., the x direction or the −x direction). In an embodiment, the first extension portion LP1 and the second extension portion LP2 may be spaced apart from each other in the pad area PDA.

The dummy pattern DP may cover the connection line CL. The dummy pattern DP may cover the connection line CL in the bending area BA. Therefore, the connection line CL may entirely overlap the dummy pattern DP in the bending area BA. For example, the connection line CL may entirely overlap the body portion BP of the dummy pattern DP in the bending area BA.

In an embodiment, the dummy pattern DP may be plural in the bending area BA. For example, the dummy pattern DP may include a first dummy pattern DP1 and a second dummy pattern DP2. The first dummy pattern DP1 and the second dummy pattern DP2 may be spaced apart from each other in the bending area BA. For example, the first dummy pattern DP1 and the second dummy pattern DP2 may be spaced apart from each other in the first direction (for example, the x direction or the −x direction). In some embodiments, one dummy pattern DP may be located in the bending area BA.

In an embodiment, the dummy pattern DP may overlap each of a plurality of connection lines CL. For example, referring to FIG. 5, the first dummy pattern DP1 may overlap three connection lines CL. Referring to FIG. 6, the first dummy pattern DP1 may overlap two connection lines CL.

The dummy pattern DP may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the dummy pattern DP may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the dummy pattern DP may further include a film including ITO, IZO, ZnO, or $In_2O_3$ above/under the reflective film. For example, the dummy pattern DP may have a multilayer structure of ITO/Ag/ITO.

The dummy pattern DP may prevent or reduce damage to the connection line CL when the bending area BA of the substrate 100 bends. Further, the dummy pattern DP may include a first extension portion LP1 and a second extension portion LP2, each of which extends to the pad area PDA, and the first extension portion LP1 and the second extension portion LP2 may be exposed to the outside in the pad area PDA. Accordingly, the resistance of the dummy pattern DP may be measured by measuring a current flowing from one of the first extension portion LP1 and the second extension portion LP2 to the other one of the first extension portion LP1 and the second extension portion LP2. Accordingly, in the present embodiment, damage to the dummy pattern DP when the bending area BA of the substrate 100 bends may be detected.

Figure 7:
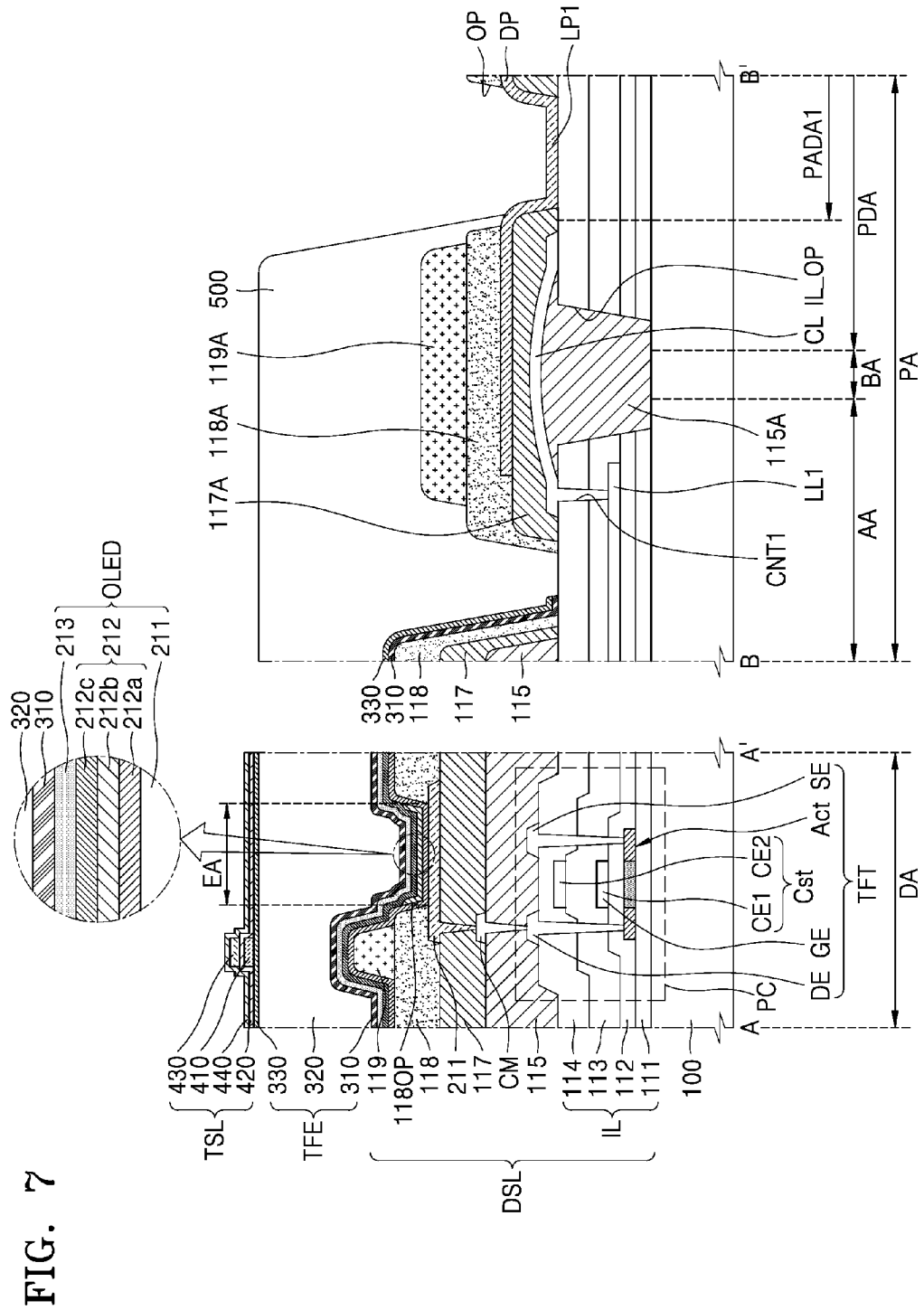
FIG. 7 is a cross-sectional view schematically illustrating a display panel, taken along line A-A' in FIG. 4 and line B-B' in FIG. 5.

FIG. 7 is a cross-sectional view schematically illustrating a display panel, taken along line A-A' in FIG. 4 and line B-B' in FIG. 5, respectively.

Referring to FIG. 7, the display panel may include a substrate 100, a display layer DSL, a thin-film encapsulation layer TFE, and a touch sensor layer TSL. The substrate 100 may include a display area DA and a peripheral area PA. The peripheral area PA may include an adjacent area AA, a pad area PDA, and a bending area BA.

The display layer DSL may be in the display area DA. The display layer DSL may include an inorganic insulating layer IL, a pixel circuit PC, a first planarization layer 115, a second planarization layer 117, and an organic light-emitting diode OLED. The inorganic insulating layer IL may include a buffer layer 111, a first gate insulating layer 112, a second gate insulating layer 113, and an interlayer insulating layer 114. The pixel circuit PC may include a thin-film transistor TFT and a storage capacitor Cst.

The buffer layer 111 may be above the substrate 100. The buffer layer 111 may include inorganic insulating materials, such as silicon nitride ($SiN_X$), silicon oxynitride (SiON), and silicon oxide ($SiO_2$), and may be a single layer or multiple layers including the aforementioned inorganic insulating materials.

The thin-film transistor TFT may include a semiconductor layer Act, and the semiconductor layer Act may be arranged above the buffer layer 111. The semiconductor layer Act may include polysilicon. Alternatively, the semiconductor layer Act may include amorphous silicon, an oxide semiconductor, or an organic semiconductor. The semiconductor layer Act may include a channel area, and a drain area and a source area at opposite sides of the channel area. The gate electrode GE may overlap the channel area.

The gate electrode GE may include low-resistance metallic materials. The gate electrode GE may include a conductive material including molybdenum (Mo), Al, copper (Cu), titanium (Ti), etc., and may include a multilayer or a single layer including those materials.

The first gate insulating layer 112 between the semiconductor layer Act and the gate electrode GE may include an inorganic insulating material, such as $SiO_2$, $SiN_X$, SiON, $Al_2O_3$, $TiO_2$, $Ta_2O_5$, hafnium oxide ($HfO_2$), or ZnO.

The second gate insulating layer 113 may be provided to cover the gate electrode GE. The second gate insulating layer 113, like the first gate insulating layer 112, may include an inorganic insulating material, such as $SiO_2$, $SiN_X$, SiON, $Al_2O_3$, $TiO_2$, $Ta_2O_5$, $HfO_2$, or $ZnO_2$.

An upper electrode CE2 of the storage capacitor Cst may be arranged above the second gate insulating layer 113. The upper electrode CE2 may overlap the gate electrode GE thereunder. In this regard, the gate electrode GE and the upper electrode CE2, which overlap each other with the second gate insulating layer 113 therebetween, may form the storage capacitor Cst. That is, the gate electrode GE may function as a lower electrode CE1 of the storage capacitor Cst.

In this way, the storage capacitor Cst and the thin-film transistor TFT may be formed to overlap each other. In some embodiments, the storage capacitor Cst may be formed so as not to overlap the thin-film transistor TFT.

The upper electrode CE2 may include Al, Pt, Pd, Ag, Mg, Au, Ni, Nd, Ir, Cr, calcium (Ca), Mo, Ti, tungsten (W), and/or Cu, and may be a single layer or multiple layers of the aforementioned materials.

The interlayer insulating layer 114 may cover the upper electrode CE2. The interlayer insulating interlayer 114 may include $SiO_2$, $SiN_X$, SiON, $Al_2O_3$, $TiO_2$, $Ta_2O_5$, $HfO_2$, or ZnO. The interlayer insulating layer 114 may be a single layer or multiple layers including the inorganic insulating material described above.

Each of a drain electrode DE and a source electrode SE may be arranged above the interlayer insulating layer 114. The drain electrode DE and the source electrode SE may include materials with good conductivity. The drain electrode DE and the source electrode SE may include a conductive material including Mo, Al, Cu, Ti, or the like, and may be a multilayer or a single layer including the above-stated material. In an embodiment, the drain electrode DE and the source electrode SE may each have a multilayer structure of Ti/Al/Ti.

The first planarization layer 115 may be arranged to cover the drain electrode DE and the source electrode SE. The first planarization layer 115 may include an organic insulating layer. The first planarization layer 115 may include a general purpose polymer such as polymethylmethacrylate (PMMA) or polystyrene (PS), a polymer derivative having a phenolic group, or an organic insulating material, such as an acrylic polymer, an imide polymer, an aryl ether polymer, an amide polymer, a fluorine polymer, a p-xylene-based polymer, a vinyl alcohol-based polymer, or a blend thereof.

A connection electrode CM may be arranged above the first planarization layer 115. At this time, the connection electrode CM may be connected to the drain electrode DE or the source electrode SE via a contact hole in the first planarization layer 115. The connection electrode CM may include a material with good conductivity. The connection electrode CM may include a conductive material including Mo, Al, Cu, Ti, etc., and may include a multilayer or a single layer including those materials. In an embodiment, the connection electrode CM may have a multilayer structure of Ti/Al/Ti.

The second planarization layer 117 may be placed to cover the connection electrode CM. The second planarization layer 117 may include an organic insulating layer. The second planarization layer 117 may include a general purpose polymer such as PMMA or PS, a polymer derivative having a phenolic group, or an organic insulating material, such as an acrylic polymer, an imide polymer, an aryl ether polymer, an amide polymer, a fluorine polymer, a p-xylene-based polymer, a vinyl alcohol-based polymer, or a blend thereof.

The organic light-emitting diode OLED may be placed on the second planarization layer 117. The organic light-emitting diode OLED may emit red light, green light, or blue light, or emit red light, green light, blue light, or white light. The organic light-emitting diode OLED may include a pixel electrode 211, an intermediate layer 212, and an opposite electrode 213.

The pixel electrode 211 may be arranged above the second planarization layer 117. The pixel electrode 211 may be electrically connected to the connection electrode CM via a contact hole in the second planarization layer 117. The pixel electrode 211 may include a conductive oxide, such as ITO, IZO, ZnO, In$_2$O$_3$, IGO, and AZO. In an embodiment, the pixel electrode 211 may include a reflective film including Ag, Mg, Al, Pt, Pd, Au, Ni, Nd, Ir, Cr, or a compound thereof. In another embodiment, the pixel electrode 211 may further include a film including ITO, IZO, ZnO, or In$_2$O$_3$ above/under the reflective film. For example, the pixel electrode 211 may have a multilayer structure of ITO/Ag/ITO.

A pixel defining layer 118 having an opening 1180P that exposes the central portion of the pixel electrode 211 may be placed on the pixel electrode 211. The pixel defining layer 118 may include organic insulating materials and/or inorganic insulating materials. The opening 1180P may define an emission area of the organic light-emitting diode OLED from which light is emitted (hereinafter, such an emission area will be referred to as a light-emitting area EA). For example, a width of the opening 1180P may correspond to a width of the emission area EA.

A spacer 119 may be above the pixel defining layer 118. The spacer 119 may include an organic insulating material such as polyimide. Alternatively, the spacer 119 may include an inorganic insulating material such as SiN$_X$ or SiO$_2$, or may include an organic insulating material and an inorganic insulating material.

In an embodiment, the spacer 119 may include a material different from a material of the pixel defining layer 118. Alternatively, in another embodiment, the spacer 119 may include the same material as a material of the pixel defining layer 118, and in this case, the pixel defining layer 118 and the spacer 119 may be formed together in a mask process by using a halftone mask or the like.

The intermediate layer 212 may be arranged above the pixel defining layer 118. The intermediate layer 212 may include an emission layer 212b at the opening 1180P of the pixel defining layer 118. The emission layer 212b may include a high molecular weight or low molecular weight organic material that emits light of a certain color.

A first functional layer 212a and a second functional layer 212c may be located below and above the emission layer 212b, respectively. The first functional layer 212a may include, for example, a hole transport layer (HTL) or may include the HTL and a hole injection layer (HIL). The second functional layer 212c is a component placed on the emission layer 212b, and may be omitted. The second functional layer 212c may include an electron transport layer (ETL) and/or an electron injection layer (EIL). The first functional layer 212a and/or the second functional layer 212c may be a common layer formed to completely cover the substrate 100, like the opposite electrode 213 to be described later below.

The opposite electrode 213 may include a conductive material having a low work function. For example, the opposite electrode 213 may include a (semi)transparent layer including Ag, Mg, Al, Pt, Pd, Au, Ni, Nd, Ir, Cr, Li, Ca, or an alloy thereof. Alternatively, the opposite electrode 213 may further include a layer such as ITO, IZO, ZnO, or In$_2$O$_3$ on the (semi)transparent layer including the above-mentioned material.

In some embodiments, a capping layer (not shown) may be further above the opposite electrode 213. The capping layer may include lithium fluoride (LiF), inorganic, and/or organic materials.

The thin-film encapsulation layer TFE may cover the organic light-emitting diode OLED. That is, the thin-film encapsulation layer TFE may be above the opposite electrode 213. In an embodiment, the thin-film encapsulation layer TFE includes at least one inorganic encapsulation layer and at least one organic encapsulation layer, and in FIG. 7, in an embodiment, the thin-film encapsulation layer TFE includes a first encapsulation layer 310, an organic encapsulation layer 320, and a second inorganic encapsulation layer 330, which are sequentially stacked.

The first encapsulation layer 310 and the second inorganic encapsulation layer 330 may include at least one inorganic material from among Al$_2$O$_3$, TiO$_2$, Ta$_2$O$_5$, HfO$_2$, ZnO$_2$, SiO$_2$, SiN$_X$, and SiON. The organic encapsulation layer 320 may include a polymer-based material. Examples of the polymer-based material may include an acrylic resin, an epoxy resin, polyimide, and/or polyethylene. In an embodiment, the organic encapsulation layer 320 may include acrylate.

The touch sensor layer TSL may be above the thin-film encapsulation layer TFE. In the touch sensor layer TSL, insulating layers and conductive layers may be alternately stacked. For example, the touch sensor layer TSL may include a first conductive layer 410 and a second conductive layer 430. In this case, a first touch insulating layer 420 may be arranged between the first conductive layer 410 and the second conductive layer 430. A second touch insulating layer 440 may be arranged above the second conductive layer 430. In some embodiments, an inorganic insulating layer may be further included between the second inorganic encapsulation layer 330 and the first conductive layer 410.

A sensor electrode of the touch sensor layer TSL and touch lines connected to the sensor electrode may be included in at least one of the first conductive layer 410 and the second conductive layer 430. The first conductive layer 410 or the second conductive layer 430 may include a metal layer or a transparent conductive layer. The metal layer may include Mo, Md, Ag, Ti, Cu, Al, and alloys thereof. The transparent conductive layer may include a transparent conductive oxide such as ITO, IZO, ZnO, and/or ITZO. In addition, the transparent conductive layer may include a conductive polymer such as poly(3,4-ethylenedioxythiophene) (PEDOT), metal nanowires, graphene, and/or the like.

The first conductive layer 410 or the second conductive layer 430 may be a single layer or multiple layers. The first conductive layer 410 and the second conductive layer 430, which are single layers, may include a metal layer or a transparent conductive layer, and materials of the metal layer and the transparent conductive layer are as described above. One of the first conductive layer 410 and the second conductive layer 430 may include a single metal layer. One of the first conductive layer 410 and the second conductive layer 430 may include a multi-layered metal layer. The multi-layered metal layer may include, for example, three layers of a Ti layer/Al layer/Ti layer or two layers of a Mo layer/Md layer. Alternatively, the multi-layered metal layer may include a metal layer and a transparent conductive layer. The first conductive layer 410 and the second conductive layer 430 may have different stack structures or may have the same stack structure. For example, the first conductive layer 410 may include a metal layer, and the second conductive layer 430 may include a transparent conductive layer. Alternatively, the first conductive layer 410 and the second conductive layer 430 may include the same metal layer.

Each of the first touch insulating layer 420 and the second touch insulating layer 440 may include an inorganic insulating material and/or an organic insulating material. The inorganic insulating material may include $SiO_2$, $SiN_x$, or SiON, and the organic insulating material may include a polymer organic material.

The inorganic insulating layer IL may be in the peripheral area PA. In an embodiment, the inorganic insulating layer IL may be in the adjacent area AA and the pad area PDA. In this case, the inorganic insulating layer IL may include a lower opening portion IL_OP. The lower opening portion IL_OP may overlap the bending area BA. For example, the lower opening portion IL_OP may be formed by overlapping an opening in the buffer layer 111, an opening in the first gate insulating layer 112, an opening in the second gate insulating layer 113, and an opening in the interlayer insulating layer 114. In FIG. 7, the lower opening portion IL_OP is formed to penetrate through the inorganic insulating layer IL, but in another embodiment, the inorganic insulating layer IL may include a groove that overlaps the bending area BA. Here, the groove may mean that a portion of the inorganic insulating layer IL is removed from the inorganic insulating layer IL in the depth direction of the inorganic insulating layer IL and the other portion remains. For example, the buffer layer 111 may be continuously arranged to correspond to the bending area BA, and each of the first gate insulating layer 112, the second gate insulating layer 113, and the interlayer insulating layer 114 may have an opening.

In an embodiment, a width of the lower opening portion IL_OP may be greater than a width of the bending area BA. At this time, the width of the lower opening portion IL_OP may be defined as the shortest distance from among a distance between the buffer layers 111 that face each other in the lower opening portion IL_OP, a distance between the first gate insulating layers 112 that face each other in the lower opening portion IL_OP, a distance between the lower opening portion IL_OP that face each other in the lower opening portion IL_OP, and a distance between the interlayer insulating layers 114 that face each other in the lower opening portion IL_OP. For example, in FIG. 7, the width of the lower opening portion IL_OP may be defined as the shortest distance between the buffer layers 111 that face each other in the lower opening portion IL_OP.

In an embodiment, an inner surface of the opening in the buffer layer 111, an inner surface of the opening in the first gate insulating layer 112, an inner surface of the opening in the second gate insulating layer 113, and an inner surface of the opening in the interlayer insulating layer 114 may be coincident. In another embodiment, any one of the inner surface of the opening in the buffer layer 111, the inner surface of the opening in the first gate insulating layer 112, the inner surface of the opening in the second gate insulating layer 113, and the inner surface of the opening in the interlayer insulating layer 114 may be in coincident with another one of the inner surface of the opening in the buffer layer 111, the inner surface of the opening in the first gate insulating layer 112, the inner surface of the opening in the second gate insulating layer 113, and the inner surface of the opening in the interlayer insulating layer 114. In this case, the lower opening portion IL_OP may have a step.

A lower organic insulating layer 115A may be arranged in the lower opening portion IL_OP. The lower organic insulating layer 115A may be arranged below the connection line CL. At this time, the lower organic insulating layer 115A may fill the lower opening portion IL_OP. Thus, the lower organic insulating layer 115A may overlap the lower opening portion IL_OP.

The lower organic insulating layer 115A may be arranged separately from the first planarization layer 115. The lower organic insulating layer 115A may include a general purpose polymer such as PMMA or PS, a polymer derivative having a phenolic group, or an organic insulating material, such as an acrylic polymer, an imide polymer, an aryl ether polymer, an amide polymer, a fluorine polymer, a p-xylene-based polymer, a vinyl alcohol-based polymer, or a blend thereof. In an embodiment, the lower organic insulating layer 115A may include the same material as a material of the first planarization layer 115. In this case, the lower organic insulating layer 115A may be formed simultaneously when the first planarization layer 115 is formed.

The first lower line LL1 may extend in the direction from the display area DA to the bending area BA. The first lower line LL1 may be in the adjacent area AA, and may be spaced apart from the bending area BA. Accordingly, the first lower line LL1 may not overlap the bending area BA. In an embodiment, the first lower line LL1 may be between the first gate insulating layer 112 and the second gate insulating layer 113. In this case, the first lower line LL1 may include the same material as a material of the gate electrode GE. The first lower line LL1 may be formed simultaneously when the gate electrode GE is formed. In another embodiment, the first lower line LL1 may be between the second gate insulating layer 113 and the interlayer insulating layer 114. In this case, the first lower line LL1 may include the same material as a material of the upper electrode CE2. The first lower line LL1 may be formed simultaneously when the upper electrode CE2 is formed. Although not shown, similar to the first lower line LL1, the second lower line may also be between the first gate insulating layer 112 and the second gate insulating layer 113 or between the second gate insulating layer 113 and the interlayer insulating layer 114.

The connection line CL may be located in the bending area BA. The connection line CL may extend in the direction from the display area DA to the pad area PDA. The connection line CL may be above the lower organic insulating layer 115A. In an embodiment, the connection line CL may include the same material as a material of the connection electrode CM. In this case, the connection line CL may be formed simultaneously when the connection electrode CM is formed. In another embodiment, the connection line CL may include the same material as a material of the source electrode SE or the drain electrode DE. In this case, the connection line CL may be formed simultaneously when the source electrode SE or the drain electrode DE is formed.

The connection line CL may be connected to the first lower line LL1 and the second lower line. That is, the connection line CL may extend to cross the bending area BA so that the first lower line LL1 is connected to the second lower line. For example, the connection line CL may be connected to the first lower line LL1 via the first contact hole CNT1 provided in the second gate insulating layer 113 and the interlayer insulating layer 114.

A first organic insulating layer 117A and a second organic insulating layer 118A may be sequentially arranged to cover the connection line CL. The first organic insulating layer 117A and the second organic insulating layer 118A may be arranged to overlap the bending area BA.

The first organic insulating layer 117A may be arranged separately from the second planarization layer 117. The first organic insulating layer 117A may include a general purpose polymer such as PMMA or PS, a polymer derivative having a phenolic group, or an organic insulating material, such as an acrylic polymer, an imide polymer, an aryl ether polymer, an amide polymer, a fluorine polymer, a p-xylene-based polymer, a vinyl alcohol-based polymer, or a blend thereof. In an embodiment, the first organic insulating layer 117A may include the same material as a material of the second planarization layer 117. In this case, the first organic insulating layer 117A may be formed simultaneously when the second planarization layer 117 is formed.

The second organic insulating layer 118A may be arranged above the first organic insulating layer 117A. The second organic insulating layer 118A may be arranged separately from the pixel defining layer 118. The second organic insulating layer 118A may include a general purpose polymer such as PMMA or PS, a polymer derivative having a phenolic group, or an organic insulating material, such as an acrylic polymer, an imide polymer, an aryl ether polymer, an amide polymer, a fluorine polymer, a p-xylene-based polymer, a vinyl alcohol-based polymer, or a blend thereof. In an embodiment, the second organic insulating layer 118A may include the same material as a material of the pixel defining layer 118. In this case, the second organic insulating layer 118A may be formed simultaneously when the pixel defining layer 118 is formed.

The dummy pattern DP may be arranged between the first organic insulating layer 117A and the second organic insulating layer 118A. At this time, the dummy pattern DP may overlap the bending area BA, and may extend from the bending area BA to the pad area PDA. For example, the dummy pattern DP may include the first extension portion LP1 that extends from the bending area BA to the first pad area PADA1.

The dummy pattern DP may be spaced apart from the display area DA. Therefore, the dummy pattern DP may not transmit a signal or voltage to the display area DA.

The dummy pattern DP may be exposed from the pad area PDA to the outside. In an embodiment, the second organic insulating layer 118A may include an insulating layer opening portion OP that overlaps the pad area PDA. Accordingly, the first extension portion LP1 of the dummy pattern DP may be exposed by the insulating layer opening portion OP.

The dummy pattern DP may cover the connection line CL. The dummy pattern DP may overlap the connection line CL in the bending area BA. In an embodiment, the dummy pattern DP may be above the connection line CL, and thus, the dummy pattern DP may include a material having a higher elongation than the connection line CL. In an embodiment, the dummy pattern DP may include the same material as a material of the pixel electrode 211. In this case, the dummy pattern DP may be formed simultaneously when the pixel electrode 211 is formed.

The dummy pattern DP may be electrically insulated from the connection line CL. In an embodiment, the dummy pattern DP may be spaced apart from the connection line CL. In addition, an insulating layer may be between the dummy pattern DP and the connection line CL and be electrically insulated from each other. The dummy pattern DP may be electrically insulated from the first lower line LL1 and the second lower line. In an embodiment, the dummy pattern DP may be spaced apart from the first lower line LL1 and the second lower line. In addition, an insulating layer is between the dummy pattern DP and the first lower line LL1 and between the dummy pattern DP and the second lower line, and the dummy pattern DP may be electrically insulated from each of the first lower line LL1 and the second lower line.

An upper insulating layer 119A may be arranged above the second organic insulating layer 118A. The upper insulating layer 119A may be arranged separately from the spacer 119. The upper insulating layer 119A may include the same material as a material of the spacer 119. In this case, the upper insulating layer 119A may be formed simultaneously when the spacer 119 is formed.

The first encapsulation layer 310 and the second inorganic encapsulation layer 330 may contact each other in the peripheral area PA. Further, in an embodiment, the first encapsulation layer 310 and the second inorganic encapsulation layer 330 may be in contact with the inorganic insulating layer IL. Therefore, external moisture and foreign substances penetrating into the display area DA may be prevented.

A bending protection layer 500 may be arranged above the upper insulating layer 119A. The bending protection layer 500 may overlap the bending area BA and be arranged above the connection line CL. When a laminate bends, a stress neutral plane may be located within the laminate. When the bending protection layer 500 is not arranged, excessive tensile stress may be applied to the connection line CL in the bending area BA as the substrate 100 or the like bends. This is because the position of the connection line CL in the bending area BA may not correspond to the stress neutral plane. However, the position of the stress neutral plane in the laminate that includes all of the substrate 100, the connection line CL, and the bending protection layer 500 in the bending area BA may be adjusted by providing the bending protection layer 500 and adjusting a thickness and modulus thereof. Therefore, the stress applied to the connection line CL in the bending area BA may be significantly reduced by placing the stress neutral plane near the connection line CL in the bending area BA through the bending protection layer 500. The bending protection layer 500 may be formed by applying a liquid or paste-type material and curing the liquid or paste-type material.

Figure 8A:
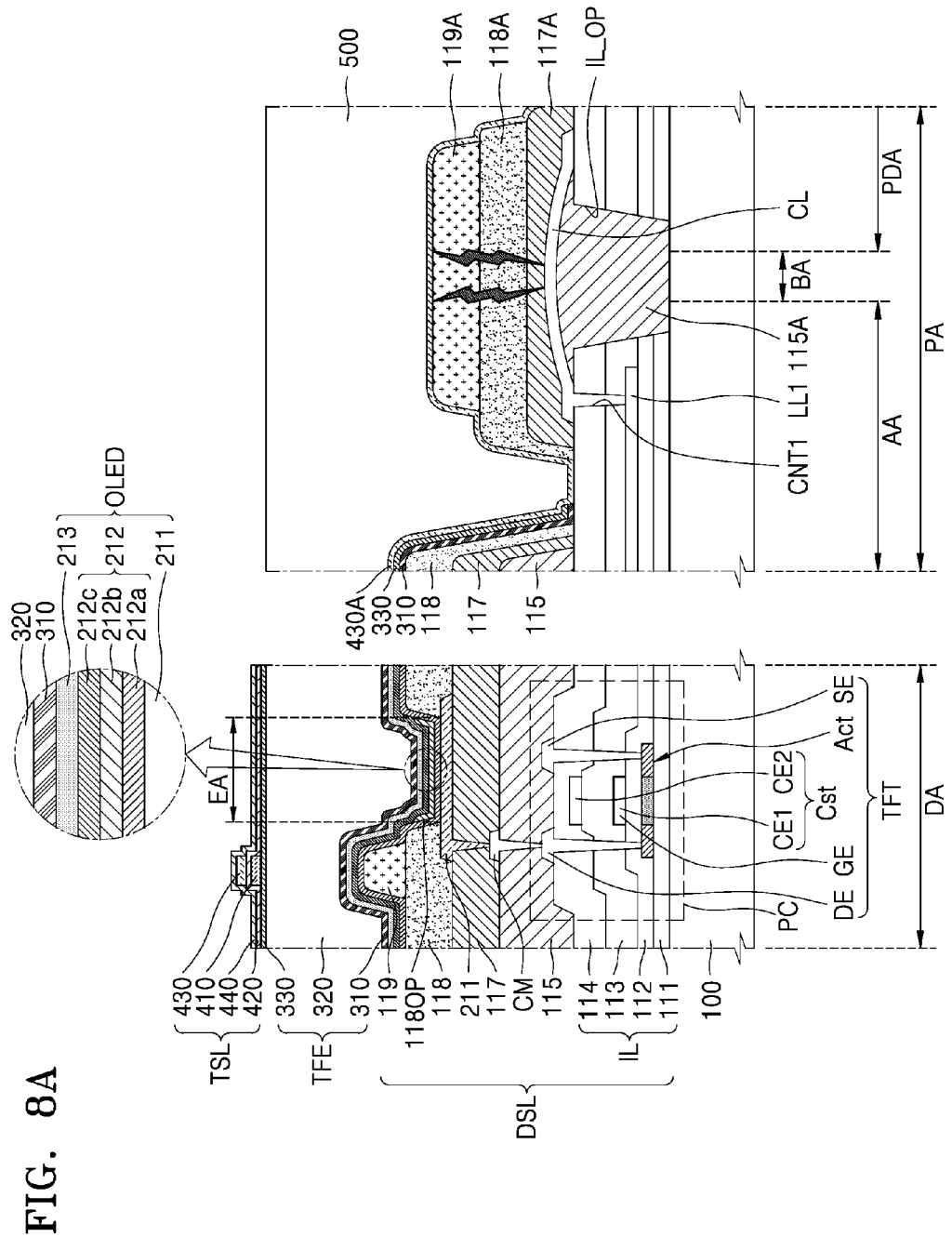
FIG. 8A is a comparative example for comparison with an embodiment of the invention.
Figure 8B:
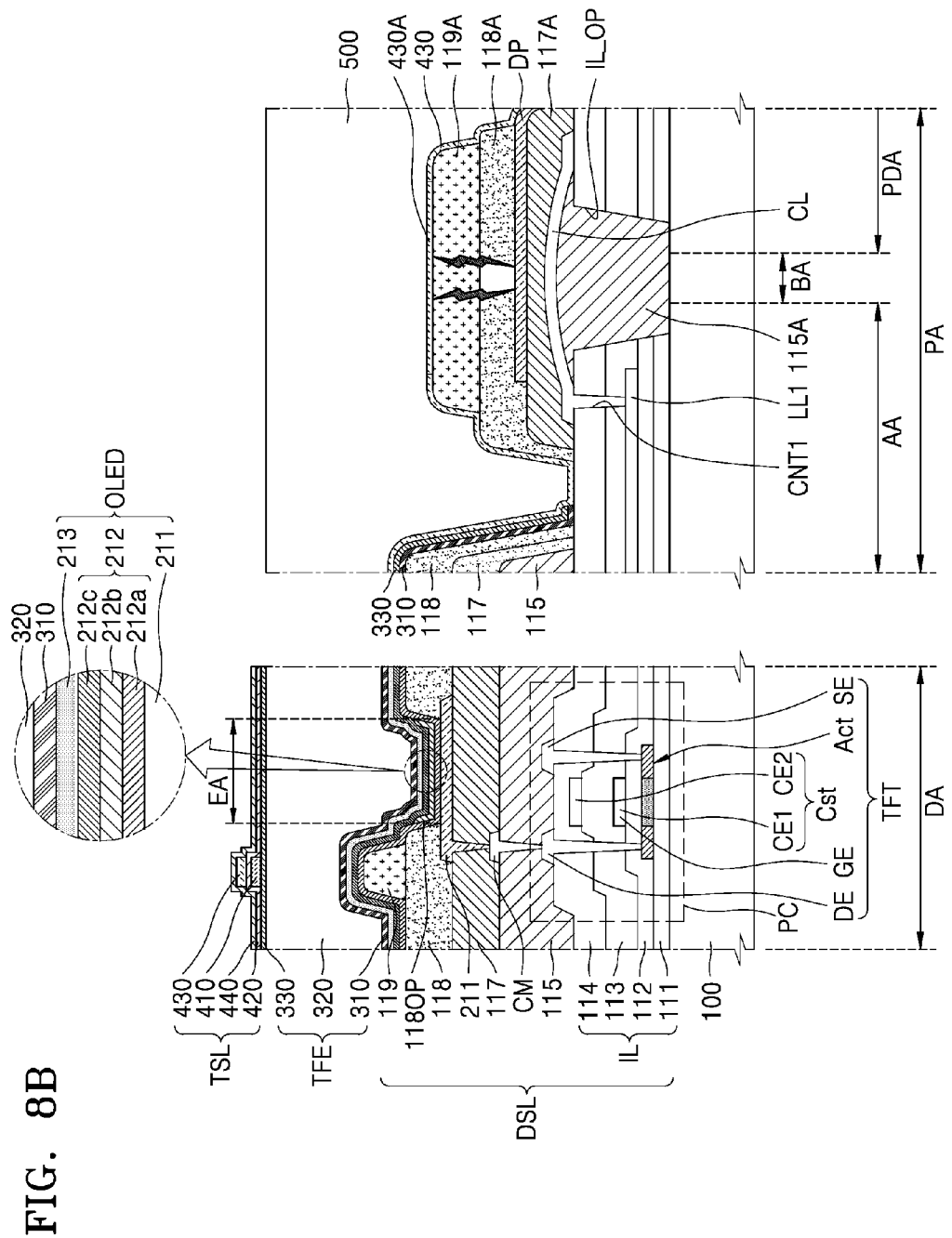
FIG. 8B is a cross-sectional view of a display panel, according to an embodiment.

FIG. 8A is a comparative example for comparison with an embodiment of the disclosure. FIG. 8B is a cross-sectional view of a display panel, according to an embodiment. Referring to FIGS. 8A and 8B, the same reference symbols as those of FIG. 7 denote the same members, and redundant description will be omitted.

Referring to FIGS. 8A and 8B, the display panel may include the substrate 100, the display layer DSL, the thin-film encapsulation layer TFE, and the touch sensor layer TSL. In this case, the touch sensor layer TSL may include the first conductive layer 410, the first touch insulating layer 420, the second conductive layer 430, and the second touch insulating layer 440.

The second conductive layer 430 may be formed by performing an etching process after entirely forming a metallic material. In this case, a process of forming the second conductive layer 430 may be performed at a low temperature. For example, the second conductive layer 430 may be formed at about 0° C. to about 150° C.

In the process of forming the second conductive layer 430, an upper metal layer 430A may be formed in the peripheral area PA. The upper metal layer 430A may be a metal layer that has not been etched in the process of forming the second conductive layer 430. In an embodiment, the upper metal layer 430A may include $TiO_2$. Because the process of forming the second conductive layer 430 is performed at a low temperature, it may be difficult to control the upper metal layer 430A not to be formed.

The upper metal layer 430A as described above may also be formed in the bending area BA. For example, the upper metal layer 430A may be above the second organic insulating layer 118A or the upper insulating layer 119A. The upper metal layer 430A may increase tensile stress in the bending area BA when the substrate 100 bends in the bending area BA. Accordingly, referring to FIG. 8A, the upper insulating layer 119A, the second organic insulating layer 118A, and the first organic insulating layer 117A may crack. The cracks may propagate to the connection line CL and damage the connection line CL.

Referring to FIG. 8B, the dummy pattern DP may be arranged between the first organic insulating layer 117A and the second organic insulating layer 118A. Therefore, even if the crack generated by the upper metal layer 430A is transmitted to the second organic insulating layer 118A, the dummy pattern DP may prevent or reduce transmission of the crack to the connection line CL. Therefore, according to an embodiment, damage to the connection line CL may be prevented or reduced, and thus, the reliability of the display panel and/or the display device may be improved.

In addition, the dummy pattern DP may be spaced apart from the display area DA, and the dummy pattern DP may not be a line that transmits signals and voltages to the display area DA. As described in FIG. 7, the dummy pattern DP extends from the bending area BA to the pad area PDA and is exposed to the outside, and thus, the resistance of the dummy pattern DP may be easily measured. When the dummy pattern DP is a line that transmits signals and voltages to the display area DA, it may be difficult to measure the resistance of the dummy pattern DP. Because the dummy pattern DP of the present embodiment is not a line that transmits signals and voltages to the display area DA, the resistance of the dummy pattern DP may be easily measured. Therefore, whether the dummy pattern DP has cracked may be checked based on a change in the resistance of the dummy pattern DP.

Figure 9:
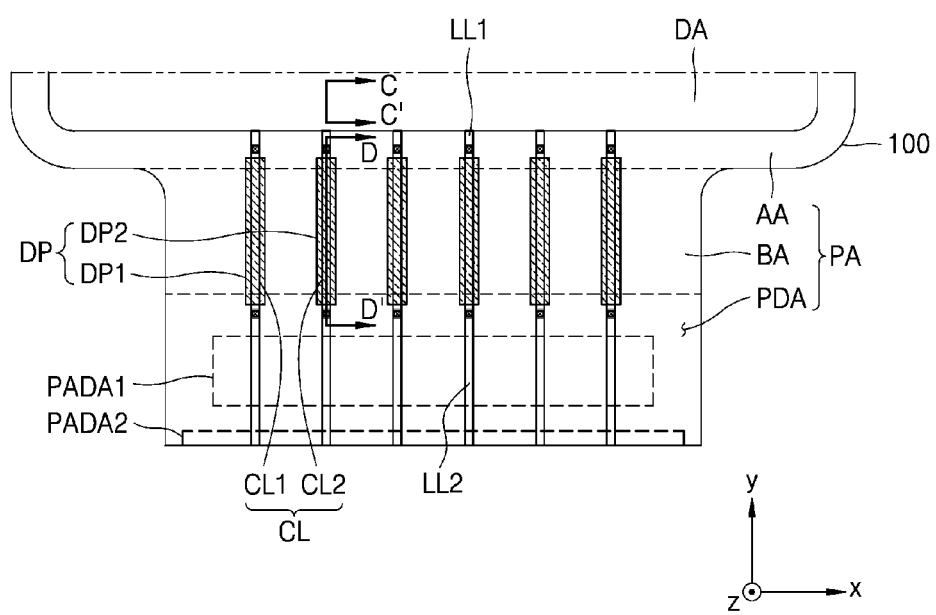
FIG. 9 is an enlarged view of a portion of a display panel, according to another embodiment.
Figure 10:
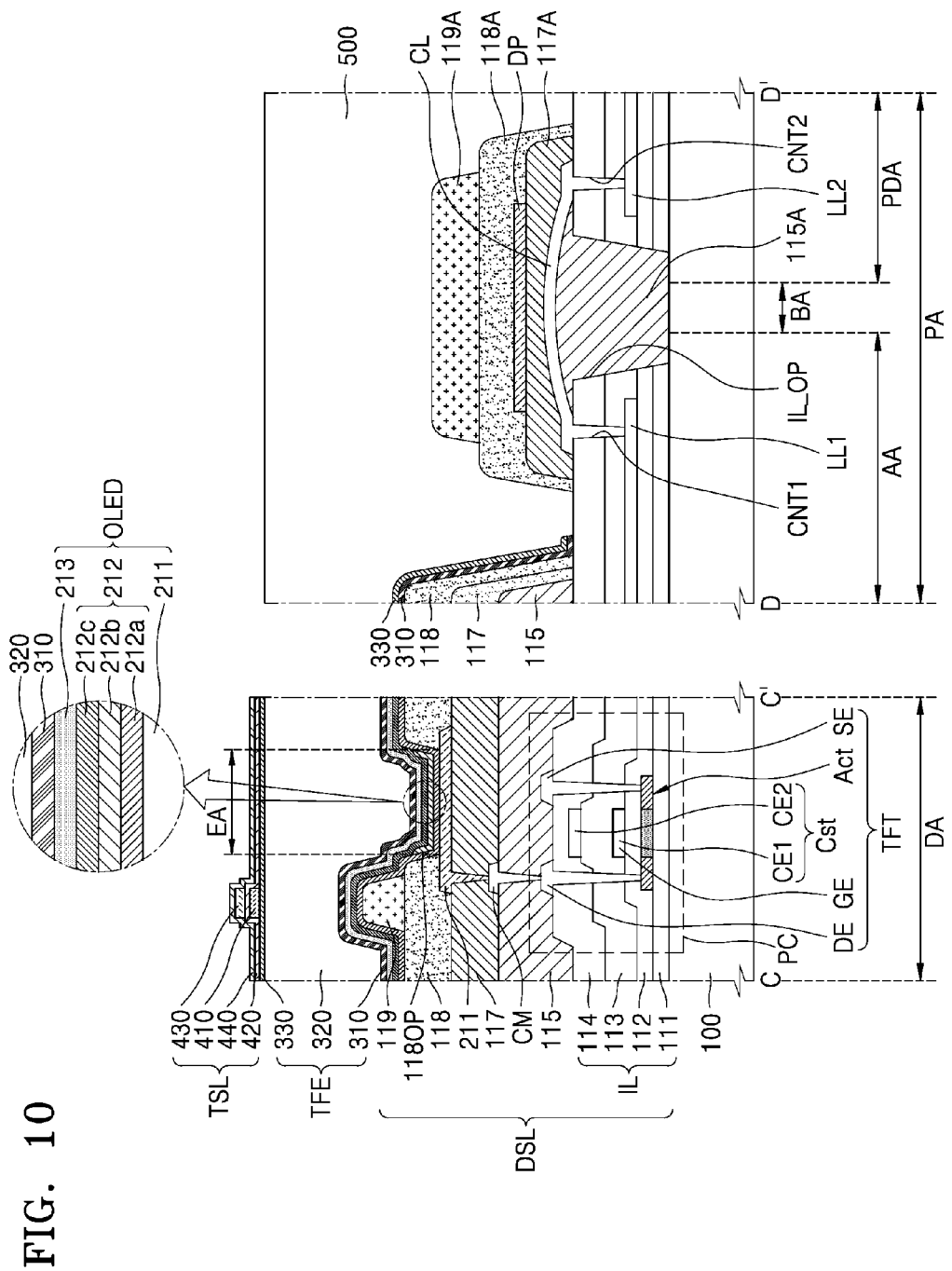
FIG. 10 is a cross-sectional view schematically illustrating a display panel, taken along lines C-C' and D-D' in FIG. 9.

FIG. 9 is an enlarged view of a portion of a display panel, according to another embodiment. FIG. 10 are cross-sectional views each schematically illustrating the display panel of FIG. 9, taken along lines C-C' and D-D' in FIG. 9. FIG. 9 shows the same members as those of FIG. 5, and thus, a duplicate description will be omitted. In FIG. 10, the same reference symbols as those of FIG. 7 denote the same member, and thus, redundant description will be omitted.

Referring to FIGS. 9 and 10, the display panel may include the substrate 100, the connection line CL, the first lower line LL1, the second lower line LL2, and the dummy pattern DP. The substrate 100 may include the display area DA and the peripheral area PA. The peripheral area PA may include the adjacent area AA, the pad area PDA, and the bending area BA.

The pad area PDA may be outside the display area DA, and the bending area BA may be between the display area DA and the pad area PDA.

The connection line CL may be in the bending area BA. The connection line CL may extend in the direction from the display area DA to the pad area PDA. The connection line CL may be plural in the bending area BA. For example, the connection line CL may include a plurality of connection lines CL, which are spaced apart from each other.

The connection line CL may be connected to each of the first lower line LL1 and the second lower line LL2. That is, the connection line CL may extend to cross the bending area BA so that the first lower line LL1 is connected to the second lower line LL2.

The dummy pattern DP may be arranged in the bending area BA. The dummy pattern DP may be spaced apart from the display area DA. For example, the dummy pattern DP may be spaced apart from the display area DA in the second direction (e.g., the y direction or the -y direction) and arranged in the peripheral area PA. In an embodiment, the dummy pattern DP may be spaced apart from the first pad area PADA1 and the second pad area PADA2. For example, the dummy pattern DP may be spaced apart from the first pad area PADA1 and the second pad area PADA2 in the second direction (e.g., the y direction or the -y direction). In this case, the dummy pattern DP may not be exposed to the outside.

The dummy pattern DP may be plural in the bending area BA. For example, the dummy pattern DP may include a plurality of dummy patterns DP, which are spaced apart from each other in the bending area BA. The plurality of dummy patterns DP may be spaced apart from each other along the first direction (e.g., the x direction or the -x direction). In this case, lines extending to the display area DA may be further arranged by utilizing an area between adjacent dummy patterns.

The plurality of dummy patterns DP may overlap the plurality of connection lines CL, respectively. For example, the plurality of dummy patterns DP may include the first dummy pattern DP1 and the second dummy pattern DP2, which are adjacent to each other. The plurality of connection lines CL may include the first connection line CL1 and the second connection line CL2, which are adjacent to each other. The first dummy pattern DP1 may overlap the first connection line CL1. The second dummy pattern DP2 may overlap the second connection line CL2. Accordingly, the plurality of dummy pattern DPs may respectively prevent the plurality of connection lines CL from being damaged, and the reliability of the display panel and/or the display device may be thus improved.

The second lower line LL2 may extend from the bending area BA in a direction away from the display area DA. The second lower line LL2 may be spaced apart from the bending area BA. Accordingly, the second lower line LL2 may not overlap the bending area BA. In an embodiment, the second lower line LL2 may be arranged between the first gate insulating layer 112 and the second gate insulating layer 113. In this case, the second lower line LL2 may include the same material as a material of the gate electrode GE. The second lower line LL2 may be formed simultaneously when the gate electrode GE is formed. In another embodiment, the second lower line LL2 may be between the second gate insulating layer 113 and the interlayer insulating layer 114. In this case, the second lower line LL2 may include the same material as a material of the upper electrode CE2. The second lower line LL2 may be formed simultaneously when the upper electrode CE2 is formed.

The second lower line LL2 may be connected to the connection line CL via the second contact hole CNT2 provided in the second gate insulating layer 113 and the interlayer insulating layer 114.

In an embodiment, the dummy pattern DP may be entirely covered by the second organic insulating layer 118A. In this case, the dummy pattern DP may not be exposed to the outside in the pad area PDA. Further, in an embodiment, the dummy pattern DP may be electrically insulated from the connection line CL. For example, the first organic insulating layer 117A is arranged between the dummy pattern DP and the connection line CL, and thus, the dummy pattern DP and the connection line CL may be electrically insulated from each other.

As described above, one or more embodiments may include a dummy pattern that is arranged between the first organic insulating layer and the second organic insulating layer. Thus, damage to a connection line in the bending area may be prevented.

Further, the dummy pattern may include a first extension portion and a second extension portion, which each extend from the bending area to the pad area. Therefore, the resistance of the dummy pattern may be measured, and damage to the dummy pattern may be detected. Thus, the reliability of the display device may be improved.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a substrate comprising a display area, a pad area, and a bending area, the pad area being located outside the display area, and the bending area being located between the display area and the pad area;
   a connection line extending in a direction from the display area to the pad area, and arranged in the bending area;
   a first organic insulating layer and a second organic insulating layer, which are sequentially arranged to cover the connection line; and
   a dummy pattern located between the first organic insulating layer and the second organic insulating layer,
   wherein:
   the dummy pattern comprises a first extension portion and a second extension portion spaced apart from each other in a plan view in the pad area;
   the first extension portion and the second extension portion each extend from the bending area to the pad area; and
   the dummy pattern comprises electrically conductive material.

2. The display device of claim 1, wherein:
   the connection line comprises a first connection line and a second connection line; and
   the dummy pattern overlaps each of the first connection line and the second connection line.

3. The display device of claim 1, wherein:
   the second organic insulating layer comprises an insulating layer opening portion overlapping the pad area; and
   at least one of the first extension portion and the second extension portion is exposed by the insulating layer opening portion.

4. The display device of claim 1, wherein the connection line and the dummy pattern are electrically insulated from each other.

5. The display device of claim 1, further comprising a display element arranged above the display area, the display element comprising a pixel electrode and an opposite electrode,
   wherein the dummy pattern comprises a same material as a material of the pixel electrode.

6. The display device of claim 5, further comprising:
   a thin-film transistor located above the substrate, the thin-film transistor being connected to the display element;
   a first planarization layer and a second planarization layer arranged between the thin-film transistor and the pixel electrode; and
   a pixel defining layer covering an edge of the pixel electrode, the pixel defining layer comprising an opening that exposes a central portion of the pixel electrode,
   wherein:
   the first organic insulating layer comprises a same material as a material of the second planarization layer; and
   the second organic insulating layer comprises a same material as a material of the pixel defining layer.

7. The display device of claim 1, further comprising an inorganic insulating layer disposed above the substrate,
   wherein the inorganic insulating layer comprises a lower opening portion that overlaps the bending area.

8. The display device of claim 7, further comprising a lower organic insulating layer disposed below the first organic insulating layer,
   wherein the lower organic insulating layer overlaps the lower opening portion.

9. The display device of claim 1, wherein the dummy pattern is spaced apart from the display area.

10. A display device comprising:
    a substrate comprising a display area, a pad area, and a bending area, the pad area being located outside the display area, and the bending area being located between the display area and the pad area;
    a connection line extending in a direction from the display area to the pad area, and arranged in the bending area;
    a first organic insulating layer and a second organic insulating layer, which are sequentially arranged to cover the connection line; and
    a plurality of dummy patterns arranged between the first organic insulating layer and the second organic insulating layer, the plurality of dummy patterns being located in the bending area.

11. The display device of claim 10, wherein:
    the plurality of dummy patterns comprise a first dummy pattern and a second dummy pattern; and
    the first dummy pattern and the second dummy pattern are spaced apart from each other in the bending area.

12. The display device of claim 11, wherein:
    the connection line comprises a first connection line and a second connection line, the first connection line and the second connection line being adjacent to each other; and
    the first connection line and the second connection line each overlap the first dummy pattern.

13. The display device of claim 11, wherein:
    the connection line comprises a first connection line and a second connection line, the first connection line and the second connection line being adjacent to each other;
    the first connection line overlaps the first dummy pattern; and the second connection line overlaps the second dummy pattern.

14. The display device of claim 11, wherein the first dummy pattern comprises a first extension portion and a second extension portion, the first extension portion and the second extension portion each extending from the bending area to the pad area.

15. The display device of claim 14, wherein:
the second organic insulating layer comprises an insulating layer opening portion that overlaps the pad area; and
at least one of the first extension portion and the second extension portion is exposed by the insulating layer opening portion.

16. The display device of claim 10, wherein the connection line and the plurality of dummy patterns are electrically insulated from each other.

17. The display device of claim 10, further comprising a display element located above the display area, the display element comprising a pixel electrode and an opposite electrode,
wherein the plurality of dummy patterns comprise a same material as a material of the pixel electrode.

18. The display device of claim 17, further comprising:
a thin-film transistor arranged above the substrate, the thin-film transistor being connected to the display element;
a first planarization layer and a second planarization layer disposed between the thin-film transistor and the pixel electrode; and
a pixel defining layer covering an edge of the pixel electrode, the pixel defining layer comprising an opening that exposes a central portion of the pixel electrode,
wherein:
the first organic insulating layer comprises a same material as a material of the second planarization layer; and
the second organic insulating layer comprises a same material as a material of the pixel defining layer.

19. The display device of claim 10, further comprising an inorganic insulating layer above the substrate,
wherein the inorganic insulating layer comprises a lower opening portion that overlaps the bending area.

* * * * *